United States Patent [19]

Borrello et al.

[11] Patent Number: 4,807,007
[45] Date of Patent: Feb. 21, 1989

[54] MIS INFRARED DETECTOR HAVING A STORAGE AREA

[75] Inventors: Sebastian R. Borrello, Dallas; Charles G. Roberts, McKinney, both of Tex.

[73] Assignee: Texas Instruments Incorporated, Dallas, Tex.

[21] Appl. No.: 820,872

[22] Filed: Jan. 16, 1986

Related U.S. Application Data

[63] Continuation of Ser. No. 538,292, Oct. 3, 1983.

[51] Int. Cl.$^4$ .................. H01L 29/78; H01L 27/14
[52] U.S. Cl. ............................. 357/30; 357/24
[58] Field of Search ............ 357/24 LR, 30 B, 30 G, 357/30 H, 30 J, 30 P

[56] References Cited

U.S. PATENT DOCUMENTS

| | | | |
|---|---|---|---|
| 3,775,646 | 11/1973 | Leclerc | 357/24 LR |
| 3,801,884 | 4/1974 | Sequin | 357/24 LR |
| 4,155,094 | 5/1979 | Ohba et al. | 357/24 M |
| 4,360,732 | 11/1982 | Chapman et al. | 357/30 |
| 4,429,330 | 1/1984 | Chapman | 357/24 LR |

FOREIGN PATENT DOCUMENTS

| | | | |
|---|---|---|---|
| 1557238 | 12/1979 | United Kingdom | 357/24 LR |
| 1592373 | 7/1981 | United Kingdom | 357/24 LR |

OTHER PUBLICATIONS

Borrello, "Photodetectors," *Encyclopedia of Chemical Technology,* vol. 17, 3rd Ed., 1982, John Wiley & Sons, pp. 601–611.

Chapman et al., "Increased Charges Capacity in . . . $Hg_{1-x}Cd_xTe$ Devices . . . ," *Appl. Phys. Lett.*, vol. 37, No. 4, 8/15/80, pp. 419–421.

Barbe, "Solid State Infrared Imaging," pp. 673–687, 1976.

*Primary Examiner*—Martin H. Edlow
*Assistant Examiner*—David J. Featherstone
*Attorney, Agent, or Firm*—Carlton H. Hoel; Leo N. Heiting; Melvin Sharp

[57] ABSTRACT

A method and an apparatus which permits use of a metal-insulator-semiconductor device as an infrared detector. A single layer of metal is provided having an extremely thin portion through which infrared radiation can pass and a thick portion through which infrared radiation cannot pass. Both of these portions together form the MIS (metal-insulator-semiconductor) gate. A voltage is applied to the metal which creates a potential well within the semiconductor substrate below. When the device is exposed to infrared radiation the radiation, causes photons to pass through the thin portion of the MIS gate and generates a charge within the potential well. The thick portion of the MIS gate shields the semiconductor substrate from photons so that no charges are generated in the potential well which is located below this portion of the metal layer. This provides a charge storage region so that the charge which is generated under the thin gate can be stored in the entire potential well created by the gate as a whole. This results in an MIS device having a detector cell which can be several times larger than photon sensitive dimensions. In effect, each detector element can have a storage capacity of a gate biased to ten volts or more. A three design is also disclosed which has the detection region separated from the storage region.

10 Claims, 6 Drawing Sheets

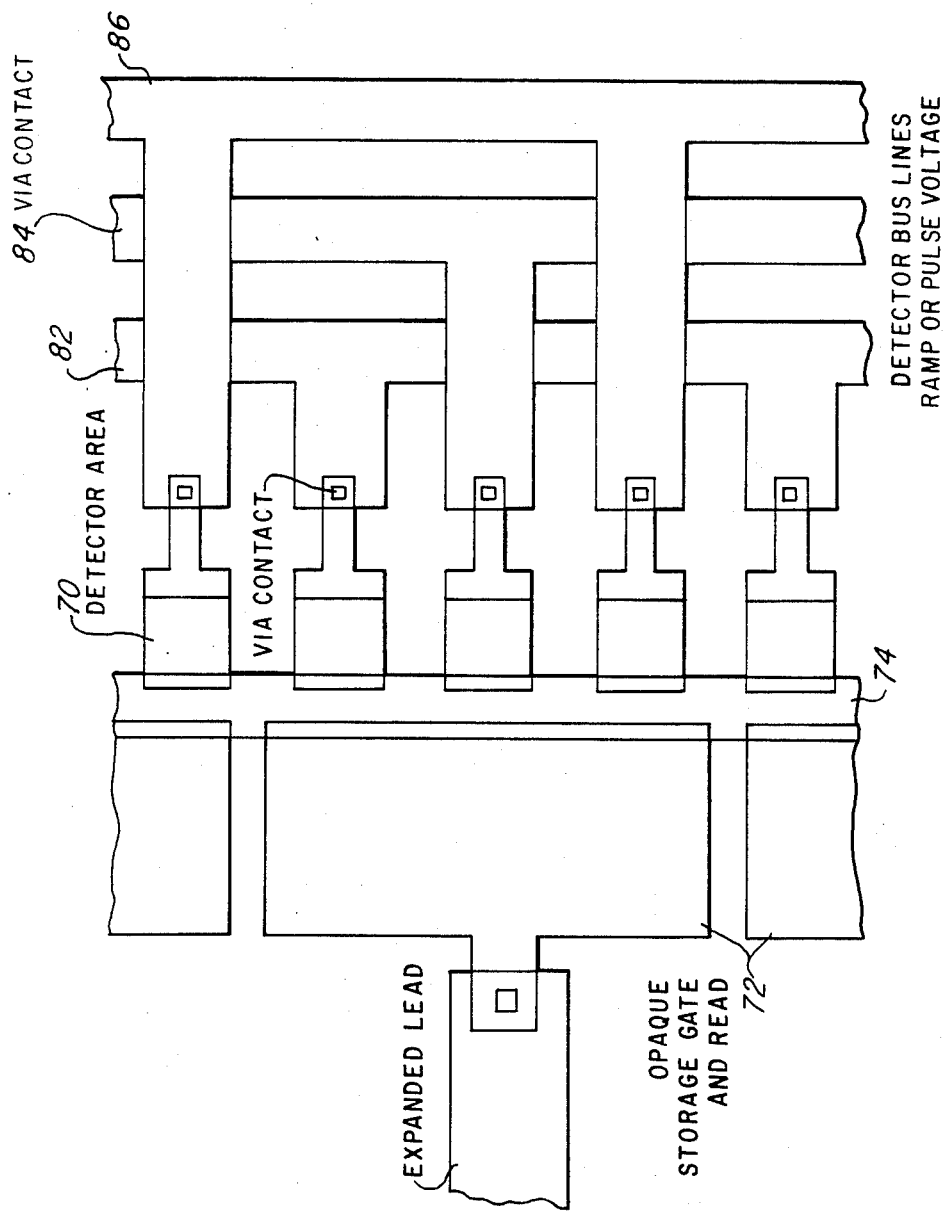

MIS INFRARED DETECTOR HAVING A STORAGE AREA

This application is a continuation of application Ser. No. 538,292, filed Oct. 3, 1983.

BACKGROUND AND SUMMARY OF THE INVENTION

Presently available infrared radiation detector devices have numerous physical limitations and electrical limitations. The prior art devices make use of a photoresistor commonly called a photoconductor circuit. In this device, a semiconductor element is placed in series with a resistance load and a current is produced by voltage. The resistance of the semiconductor substrate changes according to the infrared radiation which the semiconductor is exposed to so that the current flowing through the semiconductor and the load resistor varies. It has been a practice to use these infrared detectors in arrays of 180 or less. It has been extremely difficult to use arrays greater than 180 because of the physical limitations. For example, there is power dissipated in the semiconductor according to the joule heating effect of $P=i^2R$. In order for these devices to operate, the detector must be kept below 90° Kelvin. When a large array of these devices is built they create a great load on the cooler and make it extremely difficult to transfer the heat. Another great disadvantage of photoresistor devices is that the geometry presents physical limitations beyond the ability to etch the substrate. The third problem in these devices is the GR noise component. The generating noise comes from movement of electrons from the valence band to the conduction band which is at random. The recombining noise is also random noise independent of the generation noise as electrons move from the conduction band to the valence band. It is highly desirable to find additional methods of providing infrared detectors.

The present invention uses a metal-insulator-semiconductor (MIS) detector for infrared radiation. An MIS device does not have a current flow. Therefore a major problem in the photoresistor devices is overcome Additionally, the heat load on the cooler is considerably reduced because the lack of the current flow and the power is determined according to the formula $P=\frac{1}{2}CV^2$. In an MIS device the C is extremely small so that the power is negligible. An additional advantage of the MIS device is that a voltage is taken after an amount of charge has been integrated over a set time so that there is no recombination noise This feature alone cuts the noise in half so that the only noise is generation noise.

The following publications may be of interest in the same field as this invention. *Encyclopedia of Chemical Technology*, Volume 17, Third Edition Copyright @1982 by John Wiley & Sons, Pages 601-611. This describes an MIS devices and provides equations for MIS devices. This publication was written by one of the inventors herein and is hereby incorporated by reference into this application. A second publication which describes use of a ramp voltage for potential wells is entitled "Increased charge capacity in breakdown-limited metal-insulated-semiconductor HgCdTe devices using a ramped gate voltage", published in Applied Physics Letters Volume 37, Number 4, 15 Aug. 1980 and copyright by the American Institute of Physics, also incorporated by reference into this application.

To this point there has been extreme difficulty in producing an operable MIS infrared radiation detection device. The use of an MIS device presents an additional problems which must be solved before an MIS device can be useful as an infrared radiation detector. It is desirable to measure infrared radiation having a wavelength between the range of 3 to 5 or 8 to 12 microns because this is the wavelength of infrared radiation which is of particular interest.

The peak power of infrared radiation at 300° Kelvin has a wavelength of 10 microns. This presents the problem that an infrared radiation detector operating in this range will quickly be saturated because many surrounding objects will be at 300° Kelvin It is therefore desirable to measure all the desired infrared radiation at this temperature and not saturate the MIS device. The photon density at this temperature range is extremely large, generally in excess of $5 \times 10^{17}$ photon/cm$^2$-sec-steradians. A photon density of this magnitude quickly saturates known MIS devices because of the high density.

The present invention uses the MIS device as a photo capacitor. A metal plate is placed above the bulk, that is, substrate, with an insulator in between. When a pulse voltage is applied to the metal plate, a potential well is created in the bulk material below. This potential well represents, for n type semiconductor, the pushing of the electrons back out of that portion of the substrate and the ability of the photons to generate holes which will be attracted to the surface of the substrate and appears as voltage as the charges are collected. When a large number of holes have migrated to the surface, the device becomes saturated as represented by the well being full. At this point additional photons will not generate any additional charge in the potential well.

A solution in the past has been to attempt to increase the pulse voltage so that the well potential is greater and can hold additional charge to prevent the device from becoming saturated in a very short period of time. If the substrate being used is HgCdTe with a small band gap energy as in the present invention, an increase of voltage greater than 1 voltage as the pulse volt causes tunnelling of the electrons from the valence band and creates additional holes from the tunnelling effect which do not result from photons. The tunnelling decreases the potential of the well. The substrate of HgCdTe or other narrow bandgap semiconductors is particularly sensitive to tunnelling if the applied pulse voltage is excessive.

The timing of an MIS device is also critical. A pulse voltage must be quickly applied to the metal layer and then the voltage of the metal layer must be allowed to drift to follow the amount of charge which is built up in the potential well. Just prior to the well being saturated, the voltage difference between the semiconductor and the metal layer must be determined in order to determine the amount of infrared radiation which the substrate was exposed to. This can be an extremely short period of time and the high density of infrared radiation in the wavelength being measured causes saturation of the potential well so quickly that it is extremely difficult to measure the voltage difference after the pulse has been applied as the voltage of the metal layer is allowed to float.

The present invention solves many of the problems associated with known MIS infrared radiation detection devices. The present invention provides for the creation of a potential well of an area which is much larger than the area through which photons are allowed to pass to the substrate below. This has the effect of decreasing the photon density for the potential well in the substrate below the gate. This creates an infrared radiation detection region coupled to a charge storage region which can store all the charges as they are generated within the potential well. The detection gate, that is, the transparent gate, is kept small with respect to the overall gate area because of the high density of infrared radiation at the desired wavelength and the sensitivity of the substrate to this radiation.

In one embodiment, the entire gate is a single piece of metal with the storage gate being much thicker than the transparent gate over the infrared radiation sensitive region. This results in the entire gate being at the same voltage at all times and the potential well being equally great in the substrate beneath the entire length of the gate. A pulse voltage can be applied to the gate and then the voltage of the gate allowed to float as the device is exposed to infrared radiation After a certain period of time which will be determined as a time less than the saturation of the now extremely large storage well, the difference in voltage between the gate and the substrate is determined which will be proportional to the amount of infrared radiation which the device is exposed to. The gate may be isolated on either side by a channel stop which prevents the potential well from being created in undesired regions in the substrate or may be isolated by other methods well known.

In an alternative embodiment, the transparent gate is a separate metal strip from the storage gate. A transfer gate is placed in between the two gates to form a three gate MIS device. In this embodiment, the detector gate, which is of extremely thin metal, is pulsed with the voltage or a ramp voltage is applied to create a potential well in the substrate. As the potential well begins to fill up, the transfer gate turns on to transfer the charge to the storage region prior to the potential well under the detection gate being saturated. After the change is stored in the storage area, the amount of charge can be read by determining the voltage difference between the thick metal layer and the substrate below which represents the storage area. This embodiment is particularly useful because a ramp voltage can be applied to the detector gate or, in the alternative, constant voltage can be applied to the detector gate during the exposing of infrared radiation There is no requirement for the detector gate to have a voltage which will float because the voltage of the detector gate will not be measured. The detector gate can be subjected to a fixed voltage independent of the storage gate whose voltage must be allowed to float to determine the amount of charge stored in the charge storage region This is particularly useful if a ramp voltage is applied to the detector gate.

It has been found that the potential well can be greatly increased if a ramp voltage of a specific slope and frequency is applied to the metal layer representing the detector gate above the substrate This serves to deepen the well to a considerable extent, many more times than is possible if a pulse is used due to the physical characteristics of narrow band gap semiconductors, such as, HgCdTe. This allows an extremely large potential well to be built up with a relatively small area being used as the detection gate. As this deep potential well is filled, the ramp voltage steadily increases the voltage so that the potential well becomes deeper to prevent saturation before the desired time. As the ramp voltage reaches a peak, the transfer gate transfers the entire charge to the storage region whose voltage can be allowed to float and is not required to follow the ramp voltage which was applied to the detector gate. The charge as stored in the charge region underneath the storage gate will cause the voltage difference between the metal layer representing the storage gate and the substrate immediately below to vary in proportion to the amount of charge. This will be proportional to the amount of infrared radiation which the detector gate was exposed to.

An alternative embodiment is to have several detection regions connected to feed charge into a single storage region. A large storage region can be used to multiplex a desired number of detection gates together. This embodiment would have a plurality of detection regions connected by transfer gates to a single storage region whose charge could be read. The charge could thus be made to represent any one of several detection regions or any combination of detection regions. In this embodiment, the storage area can act as a multiplexer to select a detection region Alternatively, the storage area can be a large storage for many detection regions added together.

This invention overcomes considerable disadvantages in the prior art in the use of MIS device; as an infrared radiation detector.

It is an object of this invention to provide an MIS device which has improved characteristics for use as an infrared radiation detector.

It is an object of this invention to provide an improved method for detecting infrared radiation using an MIS device.

It is a further object of this invention to provide a means for transferring charge generated in a potential well, which was exposed to infrared radiation, to a storage area whose voltage is not tied to the voltage of the detector gate.

BRIEF DESCRIPTION OF THE DRAWINGS

FIG. 7 is the top view of the second alternative embodiment of this invention.

DETAILED DESCRIPTION OF THE INVENTION

Figure 1:
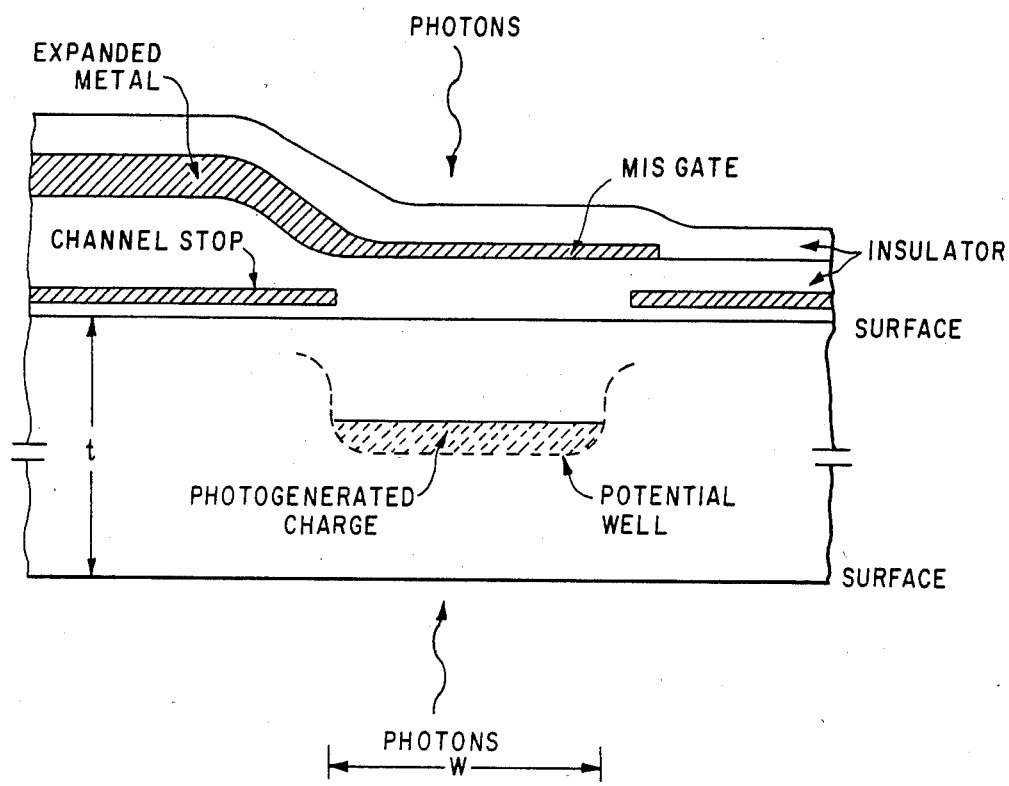
FIG. 1 is a cross-sectional view of known MIS devices.

The individual MIS devices which form the infrared detector of this invention will be arranged in an array in an infrared detector The array may be a linear continuous array or it may be an area array. Lenses are placed in front of the array to focus the infrared radiation on the particular devices within the array. The image may be swept across the array by rotating an image field mirror through a specific angle, moving the array or other focusing devices which sweep the image across the array. As the image sweeps across the array, each individual detector is exposed to a minimum resoluable portion of the image for a certain amount of time. The amount of time an individual detector is exposed is known as the dwell time. It is desirable to have the dwell time sufficiently long to receive significant data, however, it is important that the dwell time be so short that the gate is not saturated in the individual devices within the array. As the image sweeps across the individual detectors within the array, the charge is built up on the individual detectors.

It is highly desirable to integrate the charge generated for the duration of the entire dwell time. A problem encountered is that, during the dwell time, significant background radiation is being generated within the device itself. All objects between the lens and the detector which are about 300° Kelvin will be generating significant radiation. The individual devices will be exposed to this background radiation during the dwell time. The individual devices must have sufficient storage capacity so that they are not saturated by the signal which is being read and the background radiation so that the charge can be integrated over the entire dwell time with no saturation occurring at any point in time.

The individual devices of this array have been fabricated to be particularly sensitive to infrared radiation having a wave length between 8 to 12 microns. For this embodiment a substrate of HgCdTe is used in combination with nickel and/or aluminum metal gates. Some of the metals which may be used with this invention are as follows: for the thin metal detection gate, Ni, Cr, Fe; for the thick storage area, aluminum, Ni, Cr. It is to be understood that additional substrates could be substituted and additional metals could be used in place of those specified in this invention. Any semiconductor substrate, such as, indium antimonide, indium arsenide, gallium arsenide, silicon, lead tin telluride or appropriate superlattice structures would be useful as MIS devices and are substrates that could be used by this invention. The insulators which may be used with this invention include ZnS on oxidized HgCdTe (700 Angstroms), $SiO_2$ could also be used even though it has a low dielectric constant and also $Pb_2F_3$ could be used as well as other known insulators. Those of ordinary skill in the art would understand that many substrates, insulator materials, and types of metals could be substituted at different points within the scope and bounds of this invention.

This invention is described with respect to n type semiconductors however it is to be understood that the invention is equally applicable to p type semiconductors.

The MIS devices which are desirable to use at this particular wave length of interest of infrared radiation have extremely low well capacities. Because of the very low well capacities of such devices, the saturation point is reached very quickly if known techniques are used to store the charge generated while the device is exposed to infrared radiation. This is because the amount of data which must be collected during the dwell time is significantly greater than the well capacity of the device. If an attempt is made to increase the well capacity by increasing the voltage drop between the gate and the substrate, a tunnelling effect results which fills the well and creates numerous holes or electrons which saturate the well and also creates holes or electrons which are not resulted from a result of infrared radiation. Other physical limitations, such as the capacitance value of zinc sulfide, prevent increasing well capacities.

FIG. 1 is an illustration of the creation of a potential well in an MIS device. FIG. 1 demonstrates the prior art method of producing a potential well in the semiconductor substrate below the MIS gate. As shown in FIG. 1, when an electrical charge is placed on the metal MIS gate, a potential well is created When photons pass through the MIS gate to the semiconductor substrate below, the energy of the photons generates free holes which move toward the surface of the substrate and collect in the potential well. As shown in FIG. 1, the potential well has a volume which can be calculated, knowing the length, width, and potential depth of the potential well, all of which can be varied by several factors as is known in the art. A channel stop is used in the insulator to define the limits of the potential well length and width in combination with the metal MIS gate. The cross-sectional features of FIG. 1 are shown graphically in FIG. 2 which is the energy band model.

Figure 2:
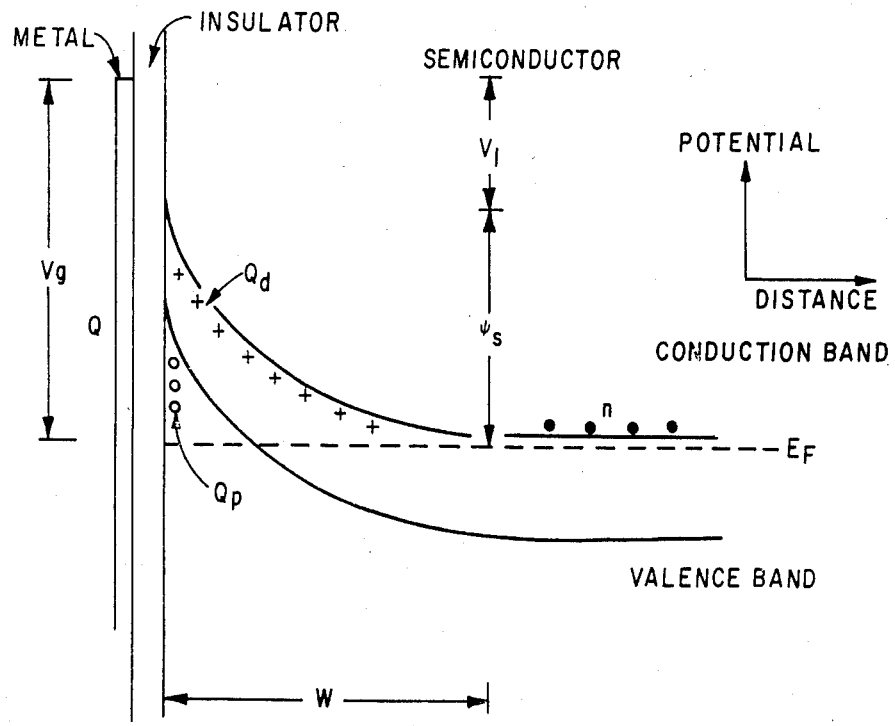
FIG. 2 shows the conduction and valence bands relative to the fermi level for an MIS gate according to the operation of this invention.

FIG. 2 is a graph with the vertical axis being voltage potential and the horizontal axis being distance. The layers of metal, insulator and semiconductor substrate are shown in their respective physical locations on this graph. The potential on this graph shows the, fermi level and the conduction and valence bands. FIG. 2 is shown with a voltage applied to the MIS gate. It is shown that the conduction band and valence band have a considerable rise in potential which is much greater ear the surface than at a depth inside the semiconductor. Electrons are forced away from the surface and enter the conduction band as shown as dots in FIG. 2 Qd represents positive charges which are produced by the electrons being driven away from the surface of the semiconductor and leaving donor impurities or energy states ionized to generate a net electrical charge density. QP represents holes which can be created and migrate to the surface when the semiconductor is exposed to infrared radiation of the desired wavelength. FIG. 2 demonstrates a portion of the operation of this invention. In this invention the voltage potential applied to the MIS gate is kept low enough to prevent tunnelling of electrons so that excessive holes are not created in the regions as shown as Qp.

Figure 3A:
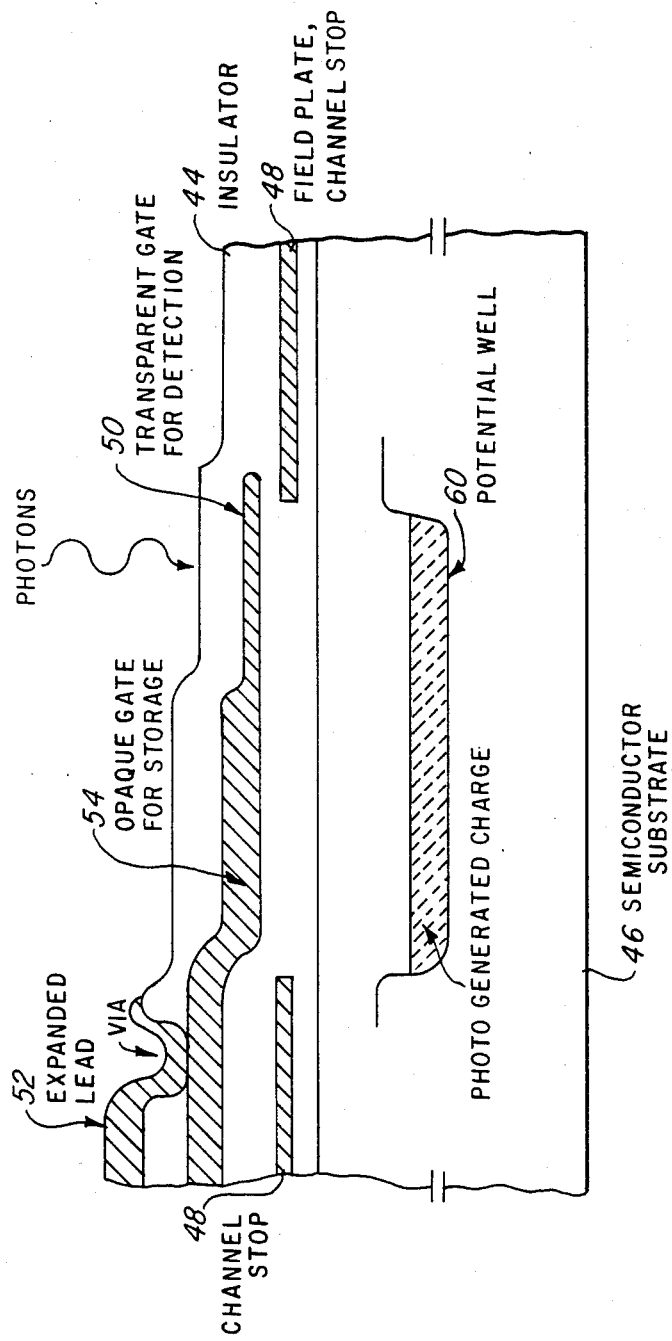
FIGS. 3A and 4A are timing diagrams for the embodiments shown in FIGS. 3 and 4 respectively.
Figure 3B:
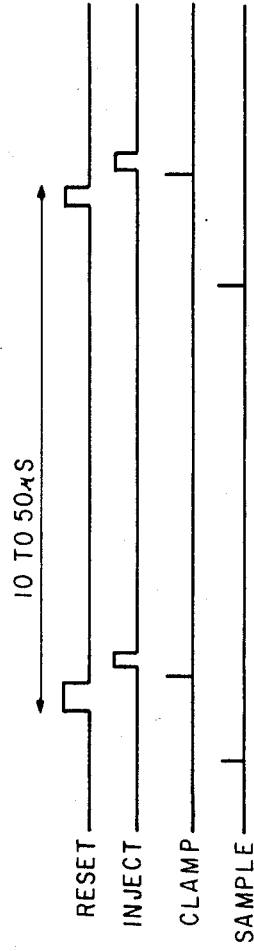
FIG. 3 is the cross-sectional view of a first embodiment of this invention.
Figure 4A:
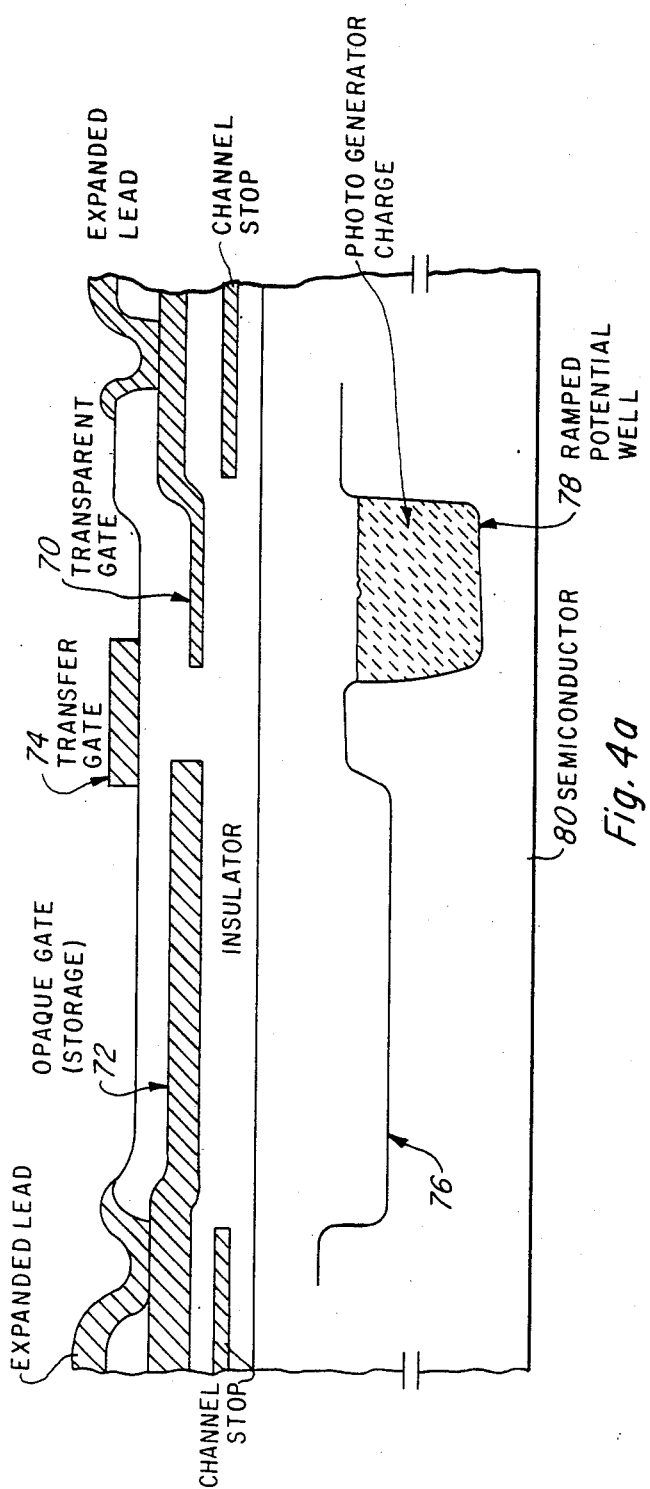
Figure 4B:
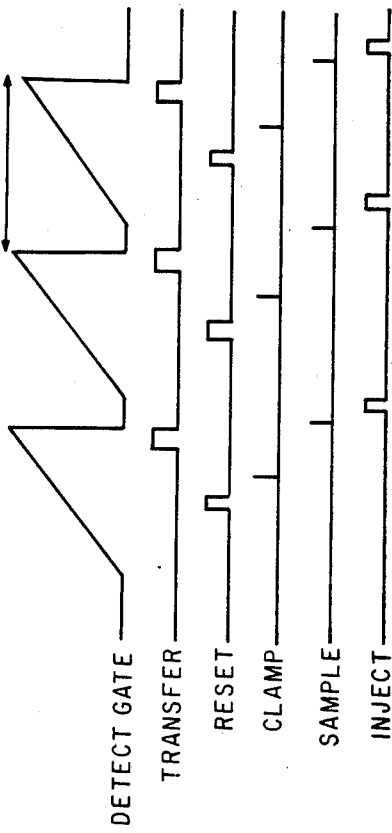
FIG. 4 is the cross-sectional view of a second alternative embodiment of this invention.

FIGS. 3 and 4 show embodiments of this invention. FIG. 3 shows a substrate 46 of HgCdTe, having an insulator 44 placed directly thereon Inside the insulator 44 is the field plate 48 which acts as a channel stop to define the location where the potential well will be created within the semiconductor substrate. The area of the gate corresponds to the area of the potential well and the depth is determined in part by the voltage applied The transparent gate 50 is comprised of extremely thin metal so as to be semi-transparent to infrared radiation. This gate 50 is physically connected to the opaque gate 54 The opaque gate 54 is so thick as to prevent infrared radiation from penetrating to the HgCdTe substrate 46 below. A well potential 60 will be directly below the transparent gate so that, when the semiconductor substrate is exposed to infrared radiation, a charge will be built up creating a voltage potential as holes migrate to the surface. This invention provides an increase to the area of this potential well significantly by connecting to the detection gate an opaque gate which creates an extended depth potential well immediately below in the semiconductor substrate. The particular structure of this invention greatly enlarges the volume of the potential well by increasing the area of the potential well.

The invention also prevents saturation of the potential well from the high density flux of infrared radiation by only allowing a small portion of the potential well to be exposed to infrared radiation. This particular feature is significant enough to produce a potential well as great as if ten times more voltage were applied to the gate to produce the potential well. This is a significant improvement in the use of MIS devices as infrared radiation detectors. This improvement permits the semiconductor substrate to remain unsaturated even when exposed for the maximum dwell time of a sweeping infrared radiation source.

The opaque gate 54 is referred to as the storage gate. The opaque gate 54 being physically connected to the transparent gate 50 creates a unitary storage area combined with the storage area of the transparent gate which can be used by all the free holes which are created by the infrared radiation. The free holes are free to migrate along the entire surface of the substrate within the entire gate area and are no longer limited to migrating to the surface at the location of the transparent gate.

The device of FIG. 3 as fabricated could have the following dimensions. The detection gate could have a thickness between 30 and 100 Angstroms. The storage gate could have a thickness between 300 and 2000 Angstroms. The insulator could have a thickness between 500 and 2000 Angstroms between the detection gate and the substrate. There could be approximately 8000 Angstroms of insulation over the detection gate for an antireflection coating. The dimensions as given have been found effective to produce an operable device as shown in FIG. 3. It can be seen that the storage gate has a thickness in the range of 10 times greater then the detection gate. A limiting factor to the two thicknesses is that the detection gate must be of such a thickness to permit infrared radiation to pass therethrough and the storage gate of such a thickness to prevent infrared radiation from passing therethrough and yet still operate as a unit piece of metal creating a single potential well below the entire gate. This device can be fabricated from a combination of metals, for example using nickel as the detection gate and aluminum as the storage gate or other combinations or single metals for the entire gates.

Specific dimensions and thicknesses have been given herein, however it is to be understood that these are given as examples. One key property of the detection gate is that it be transparent to infrared radiation. Similarly, one key property of the opaque storage gate is its opaqueness. The insulation should be the proper dimension to function in the device. The actual dimensions will change depending on the material used. Similar properties are important in the 3-gate design also.

The method of fabrication follows techniques which are known in the art. This device can be fabricated using the same techniques which fabricated the device of FIG. 1 as known to those skilled in the art of fabricating devices as shown in FIG. 1 which are part of the prior art. The method of fabrication of the device as shown in FIGS. three and 4 would be obvious to those skilled in the art of making MIS devices given this written disclosure with dimensions and the accompanying figures.

After a pulse voltage to create the potential well is applied to the entire gate, the voltage is removed and the voltage potential of the gate with respect to the substrate is allowed to float. The amount of charge as represented by free holes which were created by infrared radiation through the detection gate is integrated over the entire dwell time from start to finish. At the conclusion of the dwell time the voltage is determined which will be proportional to the amount of infrared radiation that the detection gate was exposed to. The substrate just below the detection gate is sensitive to infrared radiation due to the creation of the potential well and the detection gate is made thin enough as indicated to allow infrared radiation to pass therethrough to the sensitive substrate below. In this embodiment the substrate below the entire gate, transparent and opaque, forms the storage area even though the opaque gate is referred to as the storage gate. The substrate below the opaque gate 54 is not exposed to infrared radiation but is used to store the charge generated from the sensitive region.

The particular substrate used in the embodiment shown is HgCdTe which has a conduction and valence band pattern due to that a storage area ratio of 7 to 1 between the storage gate and the detection gate is extremely effective in producing an MIS device using HgCdTe whose potential well is large enough to remain unsaturated and yet is small enough that other problems are not encountered. It is of course possible to use a storage area twice, three, ten or other multiple larger than the detection gate depending upon the substrate, insulator and metal being used. The storage region must be sufficiently large to hold all of the integrated charge. The size of the storage region and its ratio to the detection region may be varied, depending on the materials used, the dwell time, size of the detection area and other factors. The ideal size and ratio may change with each application. This device could be made with any superlattice material appropriate for infrared detectors. The type of materials used could vary the desired ratio between the storage gate area and the detection gate area.

It is important that the region which stores the charge be sufficiently large to hold all the integrated charge over the entire dwell time or from multiple detection regions if a three gate construction is used. In a one gate construction the charge storage region is the detection region combined with the region under the storage gate. In three gate construction the charge storage region is only under the storage gate. The size of the active area, the thin metal detection gate region, is determined by the resolution requirement, focal length of the optics, and other factors depending on the application. The substrate of HgCdTe with a zinc sulfide insulator and a transparent gate of nickel with a storage gate of aluminum has been found to be particularly advantageous when the storage area is 7 times larger than the detection area. It is to be understood of course that numerous other metals, insulators and substrates could be used as has been previously mentioned herein and specific examples of those materials which may be used for this invention have previously been given.

Figure 5A:
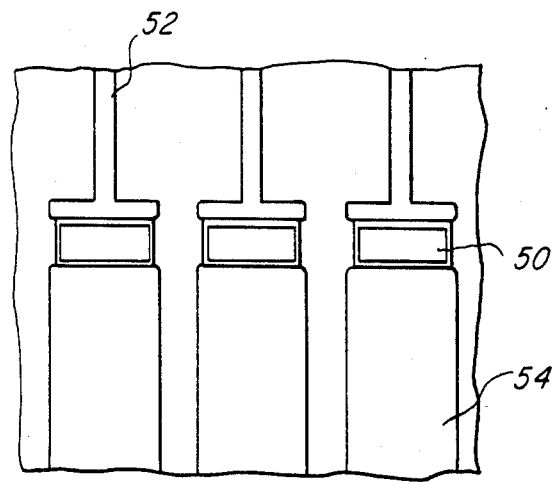
FIGS. 5A and 5B are top views of an embodiment of this invention.
Figure 5B:
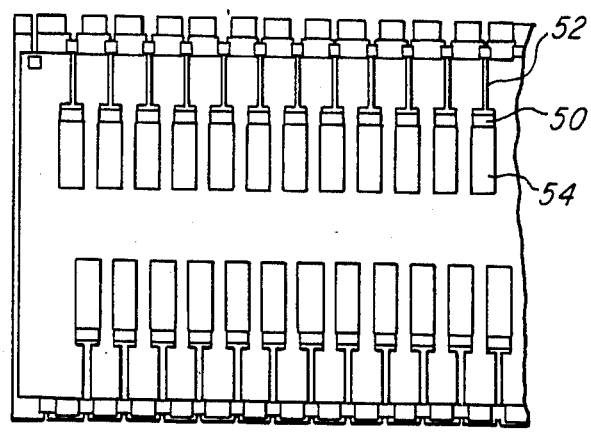

The device of this type is shown in FIGS. 5A and 5A. The detection gate appears black because the metal is so thin that the semiconductor substrate can be seen below. The lead 52 is shown connected to the gate area with the first small part of the gate being opaque area then the transparent gate and then a large opaque gate 54 which defines the storage area. An array of the devices is shown in FIG. 5B with each individual device being shown in full. The lead from each device 52 is individually connected to the proper electrode. The substrate has a common electrode connection for each of the gates. The storage area of 54 can be seen in its entirety, as can be seen in this embodiment the storage area is approximately 7 times larger than the detection area. The volume is correspondingly larger and the depth of the potential wells beneath both areas is identical.

Figure 6:
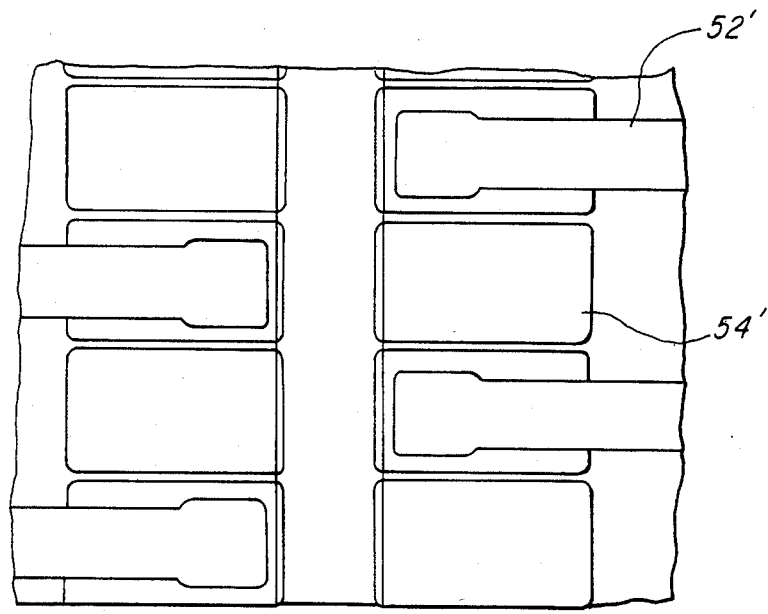
FIG. 6 is the top view of an alternative embodiment of this invention.

FIG. 6 shows an alternative embodiment of the cross-section of the device shown in FIG. 3. In this embodiment the detection gate is the center gate of the device. The opaque gate 54A which represent the storage area is spaced equally on each side of the detection gate 50A. The electrodes are shown as connecting of every other side of the storage gate.

It is significant to note that the electrode in FIG. 6, 5A, 5A, and 3 could be connected at any portion of the gate. The entire gate is a single metal strip with identical potential along the entire length thereof. The electrode is shown connected to the transparent gate in FIG. 3 but in FIGS. 5A, 5A, and 6 it is shown connected to the storage gate portion of the gate. The electrode is connected to this portion for convenience and it is to be understood that the entire gate is at the same potential so that the electrode could be connected at any portion thereof. Similarly the charge stored on both sides of the storage gate as shown in FIG. 6 will be detected by the single electrode which is connected to only one side of the storage gate. FIG. 6 has considerably higher density of infrared radiation sensitive areas than FIGS. 5A and 5B.

It can be seen that the embodiment of FIG. 6 has extremely high density infrared radiation sensitive areas and that the corresponding storage gates are significantly closer together and that a much denser pack has been achieved over that which has previously been possible. FIGS. 5A, 5B, and 6 represent embodiments of the present invention.

FIG. 3A represents a timing diagram which may be used for this invention. It is seen that a reset pulse is applied and shortly thereafter an inject pulse and a clamp pulse are used. The sample pulse is designed to sample just prior to the reset pulse being applied. The timing diagram as shown in FIG. 3A indicates respective relationships between pulses which have been used in this invention and have been found effective. It is to be understood that the actual clock rate or sequence may be varied somewhat depending on the desired application.

The devices shown in FIGS. 3 and 4 must be connected to additional control components as is well known in the art. These control components and other supporting items have not been shown because they are so well known in the art as to be obvious in their application to the invention as described herein. For example, a D.C. power supply must be connected. Means must also be provided to provide the necessary reset pulses, clamp pulses, sample pulse, inject pulse and reference bias. An appropriate sense circuit, such as a correlated double sampling amplifier, is required to detect the potential charge on the MIS gate that is indicated by the integrated charge in the well. It is well known in MIS devices with infrared detectors that they must be cooled to a low temperature. This device must be cooled to less than 85 degrees Kelvin for 8-12 micron wavelength operation. The supporting structures listed in this paragraph and other supporting structures which may be necessary for a complete operating device with readable output would be obvious to those skilled in the art of making these devices.

An alternative embodiment is shown in FIG. 4. In the embodiment of FIG. 4, the detection gate 70 is physically separated from the storage gate 72. A transfer gate 74 is shown therebetween so that the device of FIG. 4 is a three-gate infrared radiation detector. Numerous advantages are obtained by use of the three gate design. This permits control of individual detection gates. This further permits of individual storage gates completely separate from any detection gate. The transfer gate may also be individually controlled at a desired time and can be synchronized as desired It is also possible to store the charge from several detection areas in a single storage area gates to be turned on at different times to permit selected detection. Another significant advantage is that several detectors may be read simultaneously, giving a very high signal when low resolution is permitted. Another advantage of the embodiment shown in FIG. 4 is that the detection gates may be multiplexed through individual transfer gates if desired. This permits any one of several detection gates to be stored in the storage area exclusive of any other detection gate being stored in the other are or in any combinations of detection gates which may be multiplexed with the single storage area. Another advantage is that the embodiment shown in FIG. 4 permits ramping of the detection gate which is a significant advantage in some applications as explained herein.

The ramping of the detection gate voltage shown in FIG. 4A is particularly important with the substrate and metal layer of this MIS device. It has been found that, if a ramp voltage is applied with gradually increasing potential to the metal gate, a potential well is gradually deepened within the semiconductor substrate immediately therebelow. As the ramp voltage immediately increases, the potential well is able to become much larger than was previously possible using a pulse voltage or a steady state DC voltage to create the potential well. It must not be so great as to appear as a pulse voltage to the semiconductor substrate but rather must allow the potential well to be gradually increased as the voltage gradually increases. At the beginning of the ramp a very shallow potential well is formed which gradually increases in depth thus increasing the volume as the ramp voltage increases. Using this technique, a much higher final voltage can be applied to the semiconductor substrate without destruction of the potential well due to tunnelling of electrons.

It has been found that the tunnel effect of electrons can be greatly reduced while the voltage is increased if the slope of the ramp voltage is appropriately chosen for the particular situation. The slope of the ramp voltage must be greater than a threshold amount as set by the photon generation rate in order to be useful for infrared radiation detection. As the semiconductor substrate is exposed to infrared radiation, the potential well begins to fill up due to photon absorption. The potential well must deepen at a faster rate than the infrared radiation causes the potential well to be full in order to prevent saturation of the well. It is important that the ramp voltage be of seep enough slope that the potential well below the detection gate never saturates at any time even when exposed to maximum flux of infrared radiation during the dwell time. The frequency of the ramp voltage must be adjusted according to dwell time and the desired time over which the change will be integrated. A typical ramp voltage for use in the materials specified herein of HgCdTe is 100 K volts/sec and a usable frequency would be in the range of 100 K Hz.

The particular details of a ramp voltage are more fully explained in the attached paper titled "Increased charge capacity in breakdown-limited metal-insulated-semiconductor HgCdTe devices using a ramped gate voltage", which is incorporated by reference here. The timing diagram for a 3 gate MIS detector is shown illustrated in FIG. 4A. The sequence for the application of the ramp voltage to the detection gate together with time impulses for the transfer gate are shown. Also shown are pulses for the reset, clamp, sample and input. It is to be understood that these timing pulses are examples of possible embodiments and are not exclusive of possible sequences which may be used with a three gate device. The three gate device is particularly advantageous because of the different timing sequences which may be used, depending on the desired application.

The device shown in FIG. 4 has a separate storage gate which may also be termed the read gate 72. The amount of charge which was integrated over the dwell time beneath the detector gate 70 is transferred to the storage gate 72 where it may be read. The use of the three gate design is particularly advantageous in that the storage area 76 may also be used as the read area gate 76. In the design as shown in FIG. 3, the storage gate was at the same potential as the detection gate because they were all one piece of metal and were required to be directly connected to each other. A pulse voltage was applied to the detector gate and then the voltage was removed so that the potential of the entire gate could float according to the charge collected and substrate was exposed to. The use of the ramp voltage was not possible in the design of FIG. 3 because the voltage of the gate would not be allowed to float if a ramp voltage were connected to the detection gate to create a greater potential well.

In the design shown in FIG. 4 the detection gate will be at an independent potential from the transfer and storage gates. Either a pulse or a ramp voltage may be independently applied to the detection or storage gate, depending upon the desired characteristics. A ramp voltage may be applied to the detection gate to greatly increase the potential well as has been described and then the charge integrated over the dwell time is transferred to the storage and read gate whose potential is allowed to float according to the holes which represent the infrared radiation which the semiconductor substrate was exposed to. The detection gate may be kept at a constant voltage, if desired, with a constant potential well or may be pulsed or ramped as desired according to the dwell time and other physical characteristics of the infrared radiation being detected and the particular application. The potential of the storage gate may be allowed to independently float at all times or may be pulsed at different times to create a potential well of desired characteristics. This is an important feature of the structure of FIG. 4 which greatly enhances the use of an MIS device as an infrared detector.

The detection gate could have a thickness in the range of 30 and 100 Angstroms. The storage gate and transfer gates could have a thickness in the range of 300 to 2000 Angstroms. The insulation is in the range 800 to 2000 Angstroms thick below the detection gate.

The device of FIG. 4 operates by applying a desired potential voltage to the detection gate 70 to create a well 78 while exposing the semiconductor substrate 80 to an infrared radiation source simultaneously. The transfer gate 74 is biased to transfer charge from the detection gate to the storage gate prior to the detection gate becoming saturated. This may be adjusted to occur at the end of the dwell time or at a time therebetween.

The transfer gate operates by applying a pulse voltage to the metal layer which creates a potential well between the detection gate and the storage gate. The transfer gate is physically separated from either the detection or the storage gate but overlaps in areas on the semiconductor substrate immediately below the other two gates. This allows the free holes to migrate from the detection gate along the surface to the storage gate which will store the free holes near the surface. The holes flow freely and are pushed to the storage gate as the detector gate potential is momentarily collapsed. The transfer gate voltage is then reduced so that no more charge is transferred from the detection gate to the storage gate when the transfer is completed. Now the voltage of the storage gate with respect to the semiconductor substrate can be read to determine the amount of infrared radiation which the semiconductor substrate was exposed to during the desired time. In this sense, the storage gate acts as a reading gate independent of the other two gates. While the reading gate 72 is storing charge and the voltage being read, the detection gate can be operated to begin a new cycle in detecting infrared radiation. This is in additional feature which was not possible in the device shown in FIG. 3.

FIG. 7 is a top view illustrating an embodiment having a three gate design. The particular embodiment shown in FIG. 7 shows a 3 to 1 multiplexer. Any one of the three detector busses 82, 84, 86 may be pulsed at different times at a different rate for storage in the storage area. It is also possible to tie each of the detector buss lines together so that all detector gates are pulsed at the same time and stay together in the storage area. As shown in FIG. 7, the storage and read gate is arranged to receive charge from any one of three detector gates. It is to be understood that in some embodiments it may be desirable to multiplex many more than three gates to a single storage area. It may also be desirable to have a single storage gate connected to a single detector area, depending on the application.

A particular advantage of the three gate design is that the free holes from multiple detector gates can be fed by a transfer gate to a common storage area, thus, in effect, multiplexing the detection gate. The area of the storage gate can be increased as desired to multiplex the desired number of detection gates together prior to the reading of the voltage to determine the infrared radiation. This advantage performs a multiplexing function through numerous transfer gates prior to the voltage being read and is useful in large arrays of MIS device infrared radiation detectors in that it reduces the number of amplifier circuits and interconnects required. When necessary, several detectors may be read at the same time, giving a very high signal when low resolution is permitted.

The invention has been described herein with respect to numerous embodiments. It is to be understood that each of the embodiments represents the invention and that many other embodiments are also possible within the scope and spirit of the described invention which would be obvious to one of ordinary skill in the art given the design as shown in FIGS. 2-7. For example, these concepts could be applied to provide a two gate design. A two gate design would have the storage gate overlap the detection gate and be above the gate so it cannot be physically connected there and to is insulated therefrom. The distance between the storage gate and the substrate would not be so great as to prevent the creation of the potential well however. This will permit separation between the detection gate and the storage gate and would permit the storage gate to provide the transfer bias to transfer the charge from the detection gate to the storage gate where it could be stored and read.

Another application to this invention is in silicon substrates which are not used as a form of MIS devices. It is known to use a metal layer to create a potential well in a silicon substrate with no insulator therebetween and to use this device as an infrared radiation detector. This type of device usually receives radiation from the back side rather than through the metal gate. The metal gate is used to bias the substrate to create the potential well. In this type of device, the Schottky barrier is used as part of a capacitor to aid in storing the charge and no insulator is used. It would be possible for this invention to be practiced without the use of an insulator in this particular device if desired.

It is to be understood that such modifications are within the scope and balance of this invention. The invention is intended to cover not only those embodiments specifically described herein but all other forms of the inventions which would be obvious to one of ordinary skill in the art from the description contained herein.

What is claimed is:
1. An infrared radiation detection device comprising:
   (a) a semiconductor substrate,
   (b) an insulating member on said semiconductor substrate,
   (c) an electrically conductive gate layer on said insulating member spaced from said substrate and defining a potential well thereunder in said substrate, said gate having an infrared light transmissive portion and an infrared light opaque portion contiguous thereto, and
   (d) means for defining said potential well region in said substrate comprising channel stop means in said insulating member disposed beyond said electrically conductive gate layer, whereby said light transmissive portion and said light opaque portion of said electrically conductive gate layer are disposed over said substrate without intervening channel stop means,
   (e) said electrically conductive gate layer forming a gate whereby the voltage on said gate determines the amount of charge storable in the potential well region formed, and
   (f) the area of said infrared light transmissive portion determining the amount of charge stored in said potential well, said potential well including a first region of said substrate directly below the infrared light transmissive portion of said gate layer and an additional region in said substrate continuous to said first region and directly below the infrared light opaque portion of said gate layer.

2. The device according to claim 1 wherein the infrared light transmissive portion is metal and is from about 40 to about 80 Angstroms thick.

3. The device according to claim 2 wherein the infrared light transmissive portion is comprised of nickel.

4. The device according to claim 2 wherein the infrared light opaque portion is metal and is from about 400 to about 1500 Angstroms in thickness.

5. The device according to claim 4 wherein the opaque portion is connected to the transmissive portion so as to form a single electrically connected contiguous piece.

6. The device according to claim 5 wherein the opaque portion covers an area about seven times larger than that covered by the transmissive portion.

7. The device according to claim 5 wherein the opaque portion is comprised of nickel.

8. The device according to claim 5 wherein the opaque portion is comprised of nickel and aluminum.

9. The device according to claim 5 wherein the means for providing infrared radiation sensitive and charge storage regions further includes a voltage source connected to the metal layer to provide a voltage signal.

10. The device according to claim 1 wherein the semiconductor substrate is comprised of HgCdTe.

* * * * *